US 9,803,937 B2

(12) United States Patent
Franz et al.

(10) Patent No.: US 9,803,937 B2
(45) Date of Patent: Oct. 31, 2017

(54) LIQUID COOLING

(71) Applicant: Hewlett-Packard Development Company, L.P., Houston, TX (US)

(72) Inventors: John P Franz, Houston, TX (US); Tahir Cader, Liberty Lake, WA (US); Michael L Sabotta, Houston, TX (US); David A Moore, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 122 days.

(21) Appl. No.: 14/764,341

(22) PCT Filed: Jan. 31, 2013

(86) PCT No.: PCT/US2013/024037
§ 371 (c)(1),
(2) Date: Jul. 29, 2015

(87) PCT Pub. No.: WO2014/120182
PCT Pub. Date: Aug. 7, 2014

(65) Prior Publication Data
US 2015/0369544 A1    Dec. 24, 2015

(51) Int. Cl.
*F28F 7/00*    (2006.01)
*F28F 1/40*    (2006.01)
(Continued)

(52) U.S. Cl.
CPC ............ *F28F 1/40* (2013.01); *H01L 23/473* (2013.01); *H05K 7/20254* (2013.01); *H05K 7/20781* (2013.01); *H01L 2924/0002* (2013.01)

(58) Field of Classification Search
CPC ............ H05K 7/2079; H05K 7/20727; H05K 7/20254; H05K 7/20781; F28F 1/40; F28F 3/12
(Continued)

(56) References Cited

U.S. PATENT DOCUMENTS 4,714,107 A * 12/1987 Adsett ...................... F28F 3/12
165/166
5,505,533 A     4/1996 Kammersqard et al.
(Continued)

FOREIGN PATENT DOCUMENTS

CN    1653612    8/2005
CN    1956101    5/2007
(Continued)

OTHER PUBLICATIONS

Moore, et al.; Non-Final Office Action cited in U.S. Appl. No. 14/376,124; dated Jun. 14, 2017; 16 pages.
(Continued)

*Primary Examiner* — Davis Hwu
(74) *Attorney, Agent, or Firm* — Brooks, Cameron & Huebsch, PLLC

(57) ABSTRACT

An assembly for liquid cooling is provided herein. The assembly includes a thermal member, a support member, and a gasket. The thermal member includes an array of cooling pins formed of a thermally conductive material to extend from the thermal member. The support member includes an inlet channel and an outlet channel. The inlet channel to provide a fluid to the array of cooling pins. The outlet channel to receive the fluid from the array of cooling pins. The gasket between the thermal member and the support member to form a cooling channel with a fluid tight seal therebetween.

15 Claims, 8 Drawing Sheets

(51) Int. Cl.
    *H05K 7/20* (2006.01)
    *H01L 23/473* (2006.01)
(58) Field of Classification Search
    USPC .................................................. 165/80.4
    See application file for complete search history.

(56) References Cited

U.S. PATENT DOCUMENTS

| | | | |
|---|---|---|---|
| 5,514,906 A | 5/1996 | Love | |
| 5,829,514 A | 11/1998 | Smith et al. | |
| 5,867,369 A | 2/1999 | Antonuccio | |
| 5,918,469 A * | 7/1999 | Cardella | F25B 21/02 165/80.3 |
| 5,964,092 A * | 10/1999 | Tozuka | A61F 7/10 62/3.7 |
| 5,982,616 A | 11/1999 | Moore | |
| 5,986,882 A | 11/1999 | Ekrot et al. | |
| 6,084,769 A | 7/2000 | Moore et al. | |
| 6,111,749 A | 8/2000 | Lamb et al. | |
| 6,234,842 B1 | 5/2001 | Keay et al. | |
| 6,377,453 B1 | 4/2002 | Belady | |
| 6,600,649 B1 | 7/2003 | Tsai et al. | |
| 7,106,590 B2 | 9/2006 | Chu et al. | |
| 7,298,619 B1 | 11/2007 | Malone et al. | |
| 7,318,322 B2 | 1/2008 | Ota et al. | |
| 7,393,236 B2 | 7/2008 | Thompson et al. | |
| 7,450,378 B2 | 11/2008 | Nelson et al. | |
| 7,539,020 B2 | 5/2009 | Chow et al. | |
| 7,564,685 B2 | 7/2009 | Clidaras et al. | |
| 7,647,787 B2 | 1/2010 | Belady et al. | |
| 7,715,194 B2 | 5/2010 | Brewer et al. | |
| 7,764,494 B2 | 7/2010 | Balzano | |
| 7,800,900 B1 | 9/2010 | Noteboom et al. | |
| 7,907,409 B2 | 3/2011 | Wyatt et al. | |
| 7,916,480 B2 | 3/2011 | Woody et al. | |
| 7,916,483 B2 | 3/2011 | Campbell et al. | |
| 7,971,632 B2 | 7/2011 | Eriksen | |
| 8,004,832 B2 | 8/2011 | Brunschwiller et al. | |
| 8,014,150 B2 | 9/2011 | Campbell et al. | |
| 8,027,162 B2 | 9/2011 | Campbell et al. | |
| 8,050,036 B2 | 11/2011 | Suzuki et al. | |
| 2002/0021557 A1 | 2/2002 | Ishimine et al. | |
| 2004/0069455 A1 | 4/2004 | Lindemuth et al. | |
| 2004/0070949 A1 | 4/2004 | Hironori et al. | |
| 2004/0201335 A1 | 10/2004 | Davis | |
| 2005/0199372 A1 | 9/2005 | Frazer et al. | |
| 2006/0012955 A1 * | 1/2006 | Vinson | H05K 7/20727 361/695 |
| 2006/0126296 A1 * | 6/2006 | Campbell | H05K 7/2079 361/700 |
| 2006/0278372 A1 | 12/2006 | Lai et al. | |
| 2007/0034354 A1 | 2/2007 | Tung et al. | |
| 2007/0119569 A1 | 5/2007 | Campbell et al. | |
| 2007/0163749 A1 | 7/2007 | Miyahara | |
| 2007/0289718 A1 | 12/2007 | McCordic et al. | |
| 2007/0291452 A1 | 12/2007 | Gilliland et al. | |
| 2008/0271878 A1 | 11/2008 | Harvey et al. | |
| 2009/0052136 A1 | 2/2009 | Chung | |
| 2009/0065178 A1 | 3/2009 | Kasezawa | |
| 2009/0086426 A1 | 4/2009 | Brandon | |
| 2009/0266515 A1 | 10/2009 | Oikawa | |
| 2010/0032142 A1 | 2/2010 | Copeland et al. | |
| 2010/0051235 A1 | 3/2010 | Mori et al. | |
| 2010/0110621 A1 | 5/2010 | Dunn et al. | |
| 2010/0141379 A1 | 6/2010 | Tucker | |
| 2010/0149754 A1 | 6/2010 | Chapel et al. | |
| 2010/0236772 A1 | 9/2010 | Novotny et al. | |
| 2010/0290190 A1 | 11/2010 | Chester et al. | |
| 2010/0326628 A1 | 12/2010 | Campbell et al. | |
| 2011/0056674 A1 | 3/2011 | Campbell et al. | |
| 2011/0060470 A1 | 3/2011 | Campbell et al. | |
| 2011/0073726 A1 | 3/2011 | Bergesch | |
| 2011/0079376 A1 | 4/2011 | Loong et al. | |
| 2011/0242760 A1 | 10/2011 | Bott et al. | |
| 2012/0116590 A1 | 5/2012 | Florez-Larrahondo et al. | |

FOREIGN PATENT DOCUMENTS

| | | |
|---|---|---|
| CN | 101568248 | 10/2009 |
| CN | 101893921 | 11/2010 |
| CN | 102014598 | 4/2011 |
| CN | 102159058 A | 8/2011 |
| EP | 1860695 | 11/2007 |
| JP | 63-091376 | 6/1988 |
| JP | 11220281 | 8/1999 |
| JP | 2000-59062 A | 2/2000 |
| JP | 2000059062 | 2/2000 |
| JP | 2004295718 | 10/2004 |
| JP | 2010004736 | 1/2010 |
| JP | 2012248576 | 12/2012 |
| KR | 100944890 | 3/2010 |
| KR | 20110004857 | 1/2011 |
| KR | 101103394 | 1/2012 |
| WO | WO-03107523 | 12/2003 |
| WO | WO-2010062553 | 6/2010 |
| WO | WO-2011073668 | 6/2011 |
| WO | WO-2011092333 | 8/2011 |
| WO | WO 2012028718 | 3/2012 |
| WO | WO-2012157247 | 11/2012 |
| WO | WO 2012057739 | 5/2017 |

OTHER PUBLICATIONS

European Search Report dated Aug. 24, 2016, EP Application No. 13873193.0; pp. 8.
http://www.technet-alliance.com/uploads/tx_caeworld/paper_eurosime32_killat_rudnyi.pdf > On pp. 1-7, Efficient Electrothermal Simulation of Power Electronics for Hybrid Electric Vehicle, Dehbi, A. et al., Apr. 20-23, 2008.
PCT/ISA/KR, International Search Report, dated Oct. 25, 2013, PCT/US2013/024037, 17 pps.
Scofield, Bill., "Alcatel-lucent Modular Cooling System," 2010, 14 pages.
Unknown., "wiseGeek: What is a Relay Rack?" Retrieved from http://www.wisegeek.com/what-is-a-relay-rack.htm, Aug. 2011, 4 pages.

* cited by examiner

800

---

820
POSITION A FIRST SUPPORT MEMBER TO THERMALLY CONNECT A FIRST THERMAL MEMBER WITH A FIRST HEAT BLOCK

↓

840
ALIGN A SECOND SUPPORT MEMBER TO THERMALLY CONNECT A SECOND THERMAL MEMBER WITH A SECOND HEAT BLOCK.

↓

860
TRANSPORT A FLUID VIA AN INLET CHANNEL.

↓

880
REMOVE THE FLUID VIA AN OUTLET CHANNEL

*Fig. 8*

LIQUID COOLING

BACKGROUND

Electronic devices have temperature requirements. Heat from the use of the electronic devices is controlled using cooling systems. Examples of cooling systems include air and liquid cooling.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIG. 8 illustrates a flow chart of a method to remove heat from a first and second electronic device according to an example.

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs must balance conflicts between power density, spatial layout, temperature requirements, acoustic noise, and other factors. Air cooling systems typically use heat sinks and fans to remove "waste" heat from the system. The use of heat sinks and fans increase the electrical power required to operate an electronic device in an electronic system, and may cause excessive acoustic noise and lower system density. Liquid cooling can be more efficient than air cooling; however, the liquid cooling typically includes plumbing connections within the electronic devices. As the liquid goes through the plumbing connections the risk of leakage of liquid within the electronic device is introduced.

In examples, an assembly is provided. The assembly connects to an electronic device to provide liquid cooling. The heat from the electronic device transfers to the assembly via a dry disconnect. The assembly includes a thermal member, a support member, and a gasket. The thermal member includes an array of cooling pins formed of a thermally conductive material that extend from the thermal member. The support member includes an inlet channel and an outlet channel. The inlet channel to provide a fluid to the array of cooling pins. The outlet channel to receive the fluid from the array of cooling pins. The gasket between the thermal member and the support member to form a cooling channel with a fluid tight seal therebetween. The assembly may be positioned outside of the electronic device to enable the liquid cooling to occur away from the electronic device, reducing the risk of fluid leakage within the electronic device.

Figure 1:
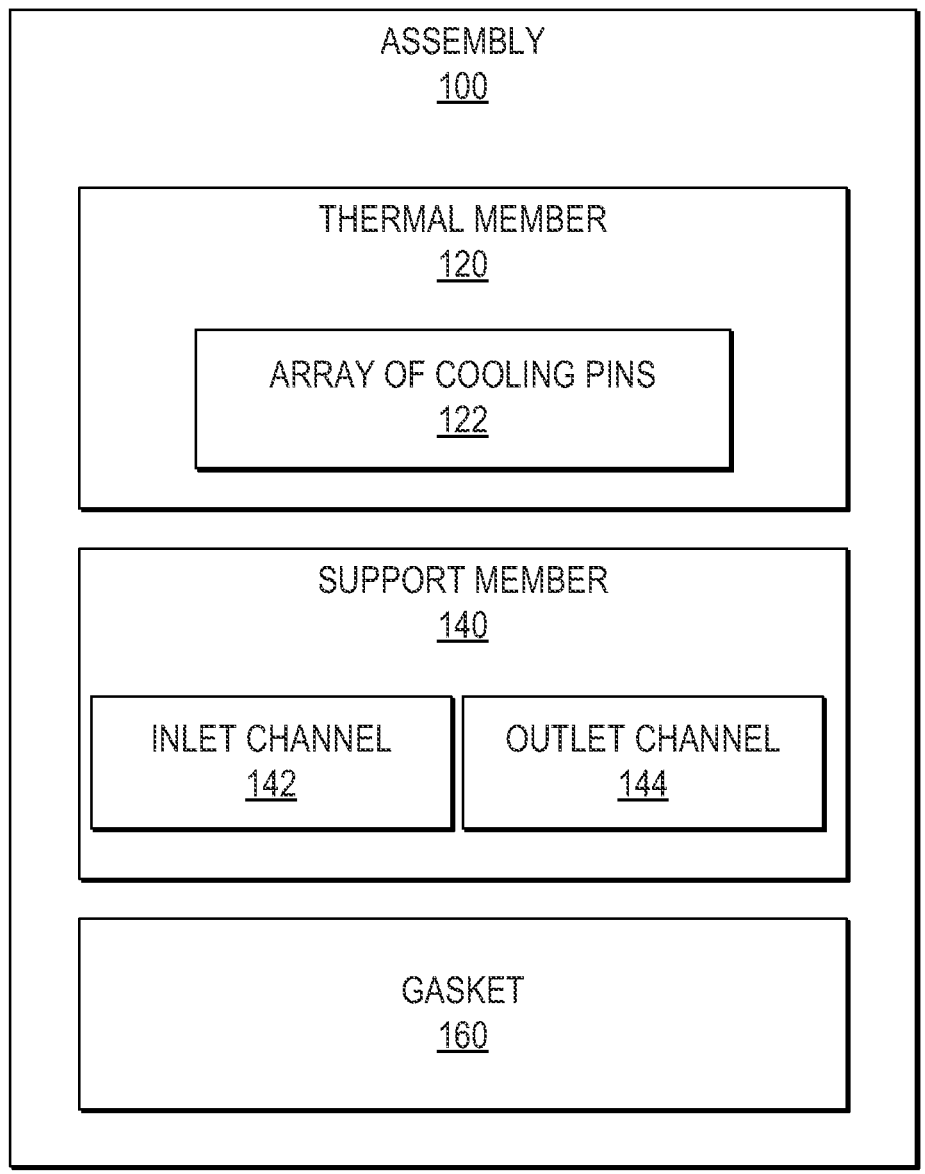
FIG. 1 illustrates a block diagram of an assembly to provide liquid cooling according to an example.

FIG. 1 illustrates a block diagram of an assembly to provide liquid cooling according to an example. The assembly 100 includes a thermal member 120, a support member 140, and a gasket 160. The thermal member 120 includes an array of cooling pins 122 formed of a thermally conductive material to extend from the thermal member 120. The support member 140 includes an inlet channel 142 and an outlet channel 144. The inlet channel 142 to provide a fluid to the array of cooling pins 122. The outlet channel 144 to receive the fluid from the array of cooling pins 122. The gasket 160 to be positioned between the thermal member 120 and the support member 140 to form a cooling channel with a fluid tight seal therebetween.

Figure 2:
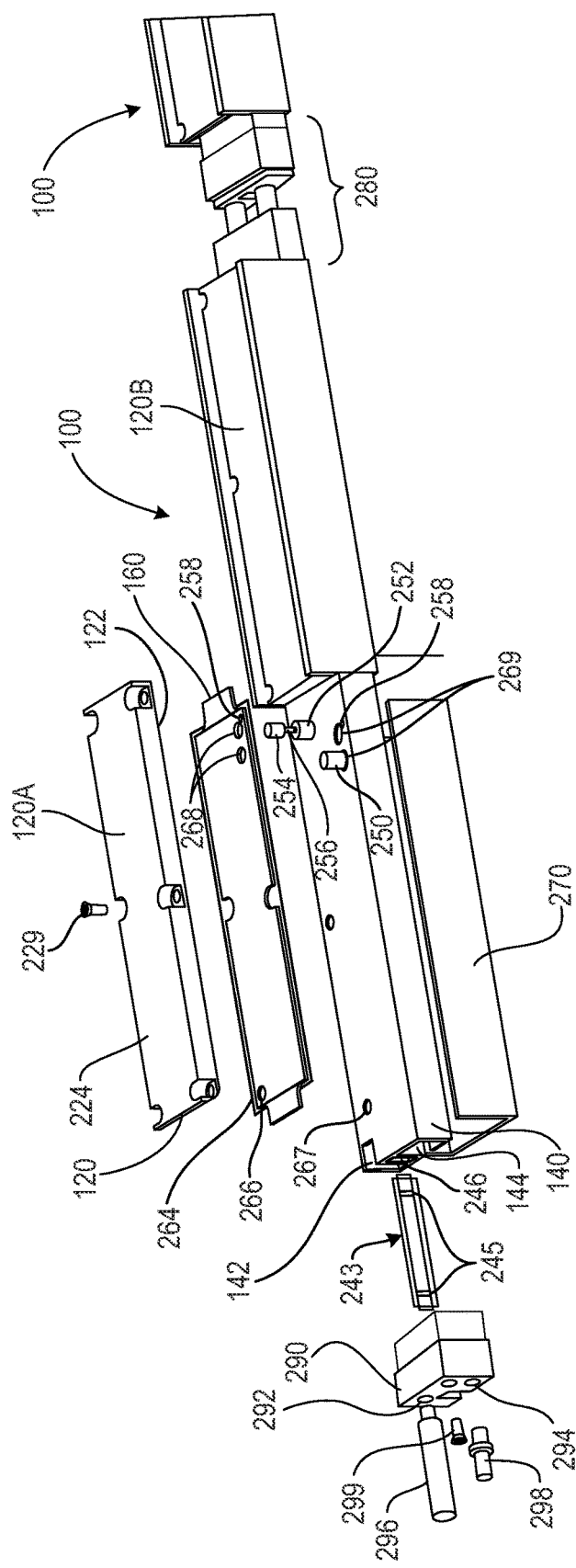
FIG. 2 illustrates an exploded view of the assembly of FIG. 1 according to an example.

FIG. 2 illustrates an exploded view of the assembly of FIG. 1 according to an example. The thermal member 120 includes the array of cooling pins 122 on one side and a mating member 224 on an opposite side. The array of cooling pins 122 are formed of a thermally conductive material that extend from the thermal member 120 towards the gasket 160 and receive the fluid therebetween. For example, the array of cooling pins 122 may include a plurality of solid protrusions arranged in an array of columns and rows to transfer heat to the fluid. The solid protrusions extend from a planar portion of the thermal member 120, i.e., a portion that forms the mating member 224, and extend towards the gasket 160. The mating member 224 to be positioned adjacent to a heat block that is thermally connected to the electronic device. The mating member 224 receives heat from an electronic device via the heat block. The fluid is distributed to a cooling channel where the fluid contacts the array of cooling pins 122 to remove the heat therefrom.

The support member 140 includes an inlet channel 142 and an outlet channel 144. For example, the support member 140 may be formed of an aluminum extrusion with the inlet and outlet channels 142, 144 or cavities formed therein. The inlet and outlet channels 142, 144 are separated by a wall and/or an air channel 246 that reduces thermal transfer between the inlet and outlet channels 142, 144. The support member 140 may further be utilized to retain a clamp member 270 or other securement structures useable with the assembly 100. For example, the air channel may be used to retain the clamp member 270. The support member 140 may further include additional structural members, such as a guide structure formed in the aluminum extrusion to position the support member 140 as it is being inserted into a rack or shelf in alignment with the compute module. The guide structures may mate or engage with the rack or shelf to hold the support member 140 in an engaged position.

The inlet channel 142 to provide a fluid to the array of cooling pins 122. The inlet channel 142 receives the fluid and transports the fluid therethrough towards the cooling channel. The fluid enters the cooling channel via an inlet interface 267 formed therein. The inlet channel 142 may include a fluid control mechanism 243 including at least one protrusion 245 extending across the inlet channel 142 to evenly or uniformly distribute the fluid to a cooling channel. For example, the fluid may encounter an array of protrusions and/or at least one elongated protrusion 245 to slow the flow of the fluid. The fluid control mechanism 243 controls the flow of the fluid using resistance, such as hydraulic or fluid resistance, to evenly or uniformly distribute the fluid across each of the thermal members 120. The resistance prevents the fluid from flowing past any one of the inlet apertures 266, which would shift the balance of the pressure.

The outlet channel 144 to receive the fluid from the array of cooling pins 122. The outlet channel 144 receives the fluid from the cooling channel and transports the fluid away from the cooling channel. The outlet channel 144 receives the fluid via an outlet interface 269 formed therein. The outlet channel 144 may also include a fluid control mechanism 243 similar to that described with respect to the inlet channel 142. The fluid control mechanism 243 to control the flow of the fluid out of the outlet channel 144 and balance the pressure in the assembly 100.

The flow of the fluid in the assembly 100 may further be controlled by at least one valve 250, such as a thermally actuated valve or a valve actuated by other control mechanisms. The valve 250 may be positioned in the cooling channel, inlet channel 142, and/or outlet channel 144 depending on design and pressure constraints. For example, valve 250 includes at least one thermally actuated valve to control the flow of the fluid through the cooling channel by extending and retracting based on the temperature of the fluid in the cooling channel. The thermally actuated valve connects to the support member 140. The thermally actuated valve extends through the outlet channel 144 and the gasket 160 into a cooling channel formed between the thermal member 120 and the gasket 160. The gasket 160 may provide a seal between the outlet channel 144 and the cooling channel, for example, a seal formed between the outlet apertures 268 and the outlet interface 269.

The thermally actuated valve includes a valve fitting 252, a valve body 254, and a resilient member 256 therebetween. The valve fitting 252 includes, for example, a threaded installation fitting within the valve fitting 252. The valve fitting 252 is fastened to the support member 140, such that the valve fitting 252 is securely attached and not moveable.

The valve body 254 is illustrated as a hollow "bell" chamber that contains the wax member therein. For example, the wax member expands as the temperature of the fluid contacting the valve body 254 increases in temperature. The expansion of the wax member causes a diaphragm (not shown) within the hollow "bell" chamber to press on a rod (not shown) that extends from the valve fitting 252 into the center of the valve body 254. The valve fitting 252 and rod do not move since the valve fitting 252 is fastened to the support member 140. However, the pressure on the rod causes the valve body 254 to extend into the cooling channel to enable the flow of the fluid through the outlet apertures 268 and the outlet interface 269 as the thermally actuated valve extends.

The resilient member 256 enables the valve fitting 252 to extend and retract based on the thermal expansion and contraction of the wax member within the valve body 254. For example, the resilient member 256 may be a return spring that provides a return force that retracts the resilient member 256 as the temperature of the wax decreases and the wax member contracts. The retraction of the resilient member 256 causes the rod to retract and restrict the flow of the fluid past the thermally actuated valve when closed.

The thermally actuated valve controls the temperature of the fluid within the cooling channel by controlling the amount of fluid that flows out of the support member 140. For example, the thermally actuated valve controls the effective aperture opening of the outlet aperture 268 as a function of the fluid temperature. In other words, the fluid at a predefined temperature causes the thermally actuated valves to extend and increase the outlet aperture 268 openings. While at a lower temperature, the thermally actuated valves may be fully retracted, thereby decreasing the outlet aperture 268 openings.

The thermally actuated valves may also control the removal of the fluid by blocking the outlet apertures 268 until a predefined temperature is attained. For example, the thermally actuated valves retard heat removal if the fluid is less than the predefined temperature. By regulating the temperate at which the fluid exits the cooling channel and the assembly 100, the heat contained within the fluid may be consistently reused for other purposes, such as heating a building that houses the electronic device. The thermally actuated valves may also improve performance in "energy re-use" applications, such as using "waste" heat from a server rack to heat a building.

Even when the valve 250 is closed, a small amount of fluid may be allowed to flow out of the cooling channel, into the outlet channel 144, and out of the assembly 100 through the outlet member 294. The small amount of fluid is continuously released via, for example, a fluid release member 258, illustrated as a small aperture extending from the outlet apertures 268 and/or the outlet interface 269. The fluid release member 258 allows air to escape from the cooling channel when the fluid initially flows across the array of cooling pins 122. Thereafter, the fluid release member 258 allows a small continual flow of fluid through the assembly 100. The fluid release member 258 is optional and may be used to ensure that fluid contacting the valve 250 is representative of the temperature of the fluid in the thermal member 120.

The release of the heated fluid via the valves 250 also enables the fluid at a lower temperature to be continually supplied, which regulates the temperature of the fluid that flows across the array of cooling pins 122 and continually enables removal of heat from the thermal member 120. It should be noted that the valves 250 are intended to alter the flow of the fluid. The use of the thermally activated valves to regulate flow of the fluid may increase or reduce the volume of the water flowing through the cooling channel. For example, the valves 250 may limit the flow of the fluid to only allow the fluid to exit when the fluid reaches a predefined temperature.

The gasket 160 to be positioned between the thermal member 120 and the support member 140 to form a cooling channel with a fluid tight seal therebetween, i.e., along the perimeter of the cooling channel 326. The gasket 160 includes a seal member 264. The seal member 264 extends between the thermal member 120 and the support member 140 and selectively compresses to align the mating member 224 flush with a heat block that receives heat from an electronic device. For example, the seal member 264 extends past the perimeter of the thermal member 120 and support member 140 to provide a fluid tight seal therebetween. The seal member 264 may be formed of a silicone or rubber material. The fluid tight seal also prevents fluid from leaking and/or bypassing the array of cooling pins 122. The array of cooling pins 122 may extend to contact the gasket 160 to provide additional assurance that the fluid does not bypass the cooling pins. The compressible gasket 160 enables the array of cooling pins 122 to contact the gasket 160 and form the fluid tight seal.

The compressibility of the seal member 264 also provides the ability to properly align the thermal member 120 against the heat block such that the thermal member 120 lies flush with the heat block and forms a thermal connection that transfers heat therebetween via a dry disconnect. For example, the seal member 264 may be compressed one to two millimeters to enable fine alignment of the thermal member 120 and account for adjustments necessary to accommodate tolerances between the thermal member 120 and the heat block and improve surface contact therebetween.

The gasket 160 further includes an inlet aperture 266 and at least one outlet aperture 268, illustrated as two outlet apertures. The inlet aperture 266 interfaces with the inlet channel 142 at the inlet interface 267 and the outlet aperture 268 interfaces with the outlet channel 144 at the outlet interface 269. The inlet and outlet apertures 266, 268 may provide a seal around the openings to prevent leaks around to inlet and outlet interfaces 267, 269. Moreover, when the valve 250 is inserted through the inlet and/or outlet apertures 266, 268, the inlet and outlet apertures 266, 268 provide thermal isolation to prevent contamination of the fluids in the inlet and/or outlet channels 142, 144 from being heated or cooled by the water in the cooling channel, i.e., the fluid surrounding the array of cooling pins 122.

A support member 140 supports at least one thermal member 120. For example, the assembly 100 illustrated includes two thermal members 120 connected to a support member 140. The thermal members 120 may be connected to the support member 140 and the gasket 160 using, for example, at least one fastener 229, such as such as a clip, an adhesive gasket, and/or a screw. The fluid control mechanism 243 may be a separate insert to slideably attach to the inlet channel 142. For example, the fluid control mechanism 243 may include an orifice or a first protrusion 245 prior to the inlet interface 267 of the first thermal member 120A and a second protrusion 245 prior to the inlet interface 267 of the second thermal member 120B. The assembly 100 also illustrates that the support members 140 may be connected to one another using a connector member 280 that enables movement or adjustment between the support members 140. The movement allows for the thermal member 120 to mate and align with a heat block by taking into account tolerance and alignment variations between adjacent heat blocks, i.e., the movement allows angular adjustments.

The assembly 100 may further include a clamp member 270 that encases the support member 140. The clamp member 270 may hold the thermal member 120 and gasket 160 together. The clamp member 270 may also hold the whole assembly 100 against the heat block to provide pressure and improve the thermal connection between the thermal member 120 and the heat block. For example, the clamp member 270 is formed of stainless to provide strength and withstand high yield stress. The clamp member 270 may include a straddle clamp to engage with the air channel 246. A spring or springs may be used to provide a force to pull the thermal member 120 towards the heat block on the electronic device. The spring may be loaded and/or unloaded using, for example, a mechanical assembly with gears to load and unload the springs.

The assembly 100 may also include an end cap 290 with an inlet member 292 and an outlet member 294. The end cap 290 may be formed of a rigid member, such as a dense piece of foam. The inlet member 292 and the outlet member 294 are connected to the inlet channel 142 and the outlet channel 144, respectively. For example, the inlet member 292 and the outlet member 294 are positioned diagonal to one another. A fluid supply line 196 is connected to the inlet member 292 to supply fluid to the inlet channel 142 and fluid return line 298 is connected to the outlet member 194 to remove the fluid from the outlet channel 144. A fastener 299, such as a clip, an adhesive gasket, and/or a screw, may also be used to secure the end cap 290 to the support member 140.

The fluid enters the assembly 100 at the end cap 290. The temperature of the fluid that enters the assembly 100 may be optionally monitored and set at a predefined temperature (range) prior to use in the assembly 100. The fluid temperature rises as the fluid absorbs heat from the thermal members 120. The fluid typically exits the assembly 100 at a higher temperature. The fluid exchanges between the end cap 290, the inlet and outlet channels 142, 144, the gasket 160, and the thermal member 120 are the only fluid exchanges required in the assembly 100. The assembly 100 provides an efficient liquid cooling method that cools electronic devices by removing heat transported to the heat block, such as an outer surface of electronic device without the risk of leakage within the electronic device. For example, in a server the liquid cooling occurs at the rack level instead of the server level where the central processing unit and other electronic components are located.

Figure 3:
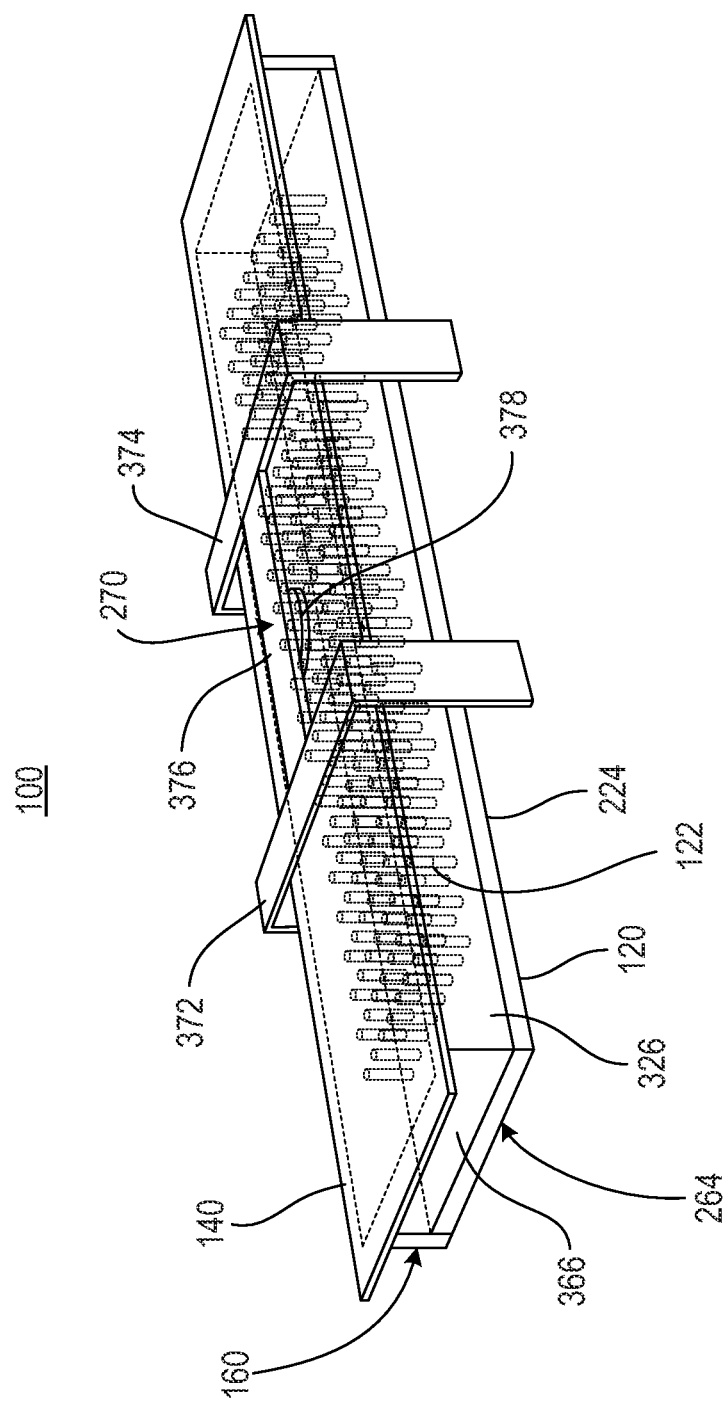
FIG. 3 illustrates a perspective view of the assembly of FIG. 1 according to an example.

FIG. 3 illustrates a perspective view of a portion of the assembly 100 of FIG. 1 according to an example. The assembly 100 illustrates an alternate example of the thermal member 120 with an array of cooling pins 122, the gasket 160 with a flexible side wall 366, and a clamp member 270. The array of cooling pins 122 extend from the thermal member 120 towards the gasket 160.

The gasket 160 includes a seal member 264 to engage with the support member 140. The seal member 264 includes a flexible side wall 366 formed to extend from the perimeter of the thermal member 120. The flexible side walls 366 encase the array of cooing pins 122 therein to form a cooling channel 326. The flexible side wall 366 selectively compresses to align the mating member 224 flush with a heat block that receives heat from an electronic device.

The clamp member 270 includes a first clamp 372, a second clamp 374, and a cross bar 376 between the first clamp 372 and the second clamp 374. The cross bar 376 engages with a load structure 378 that allows the assembly 100 to pivot when the flexible side walls 366 are compressed, to provide better contact and alignment with a mating surface of the heat block.

Figure 4:
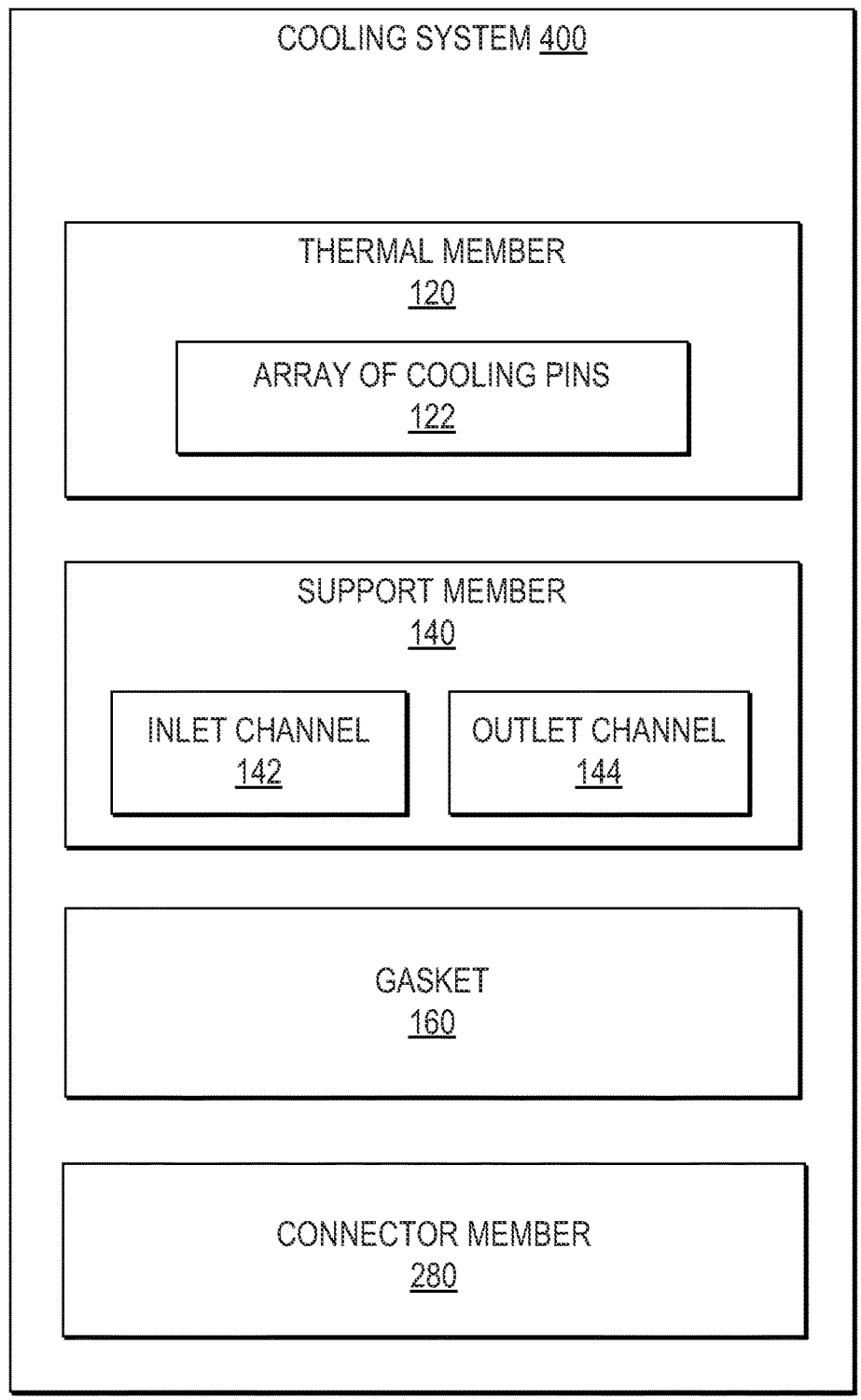
FIG. 4 illustrates a block diagram of a cooling system according to an example.

FIG. 4 illustrates a block diagram of a cooling system 400 according to an example. The cooling system 400 includes a thermal member 120, a support member 140, a gasket 160, and a connector member 280.

The thermal member 120 includes an array of cooling pins 122 formed of a thermally conductive material that extend from the thermal member 120. The support member 140 includes an inlet channel 142 and an outlet channel 144. The inlet channel 142 to provide a fluid to the array of cooling pins 122. The outlet channel 144 to receive the fluid from the array of cooling pins 122. The gasket 160 to be positioned between the thermal member 120 and the support member 140 to form a cooling channel 326 with a fluid tight seal therebetween. The connector member 280 extends from the support member 140 to provide movement of the support member 140 during alignment of the thermal member 120 with a heat block.

Figure 5:
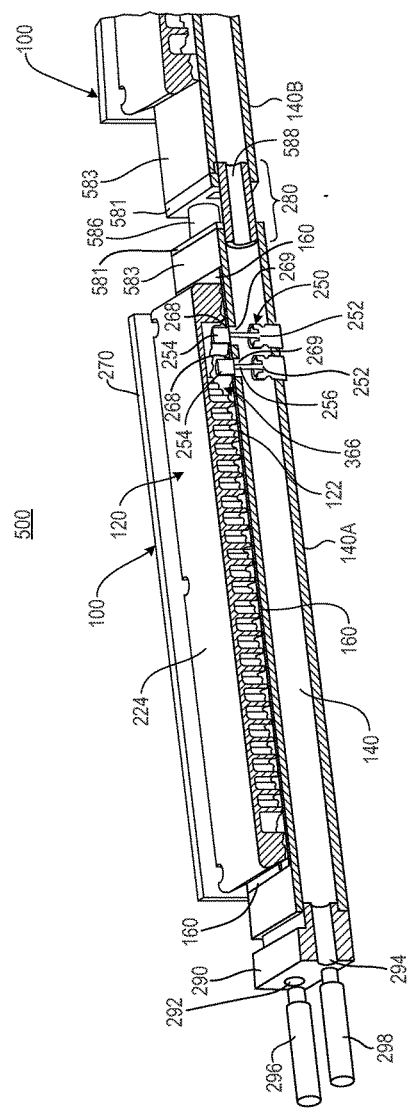
FIG. 5 illustrates a cross-sectional view of the cooling system of FIG. 4 according to an example.

FIG. 5 illustrates a cross-sectional view of the cooling system of FIG. 4 according to an example. The thermal member 120 includes the array of cooling pins 122 on one side and a mating member 224 on an opposite side. The array of cooling pins 122 are formed of a thermally conductive material that extend from the thermal member 120 towards the gasket 160 and receive the fluid therebetween. For example, the array of cooling pins 122 may include a plurality of solid protrusions arranged in an array of columns and rows. The solid protrusions extend from a planar portion of the thermal member 120 and extend towards the gasket 160. The mating member 224 to be positioned adjacent to a heat block such that the mating member 224 receives heat from an electronic device. The fluid is distributed to a cooling channel 326 and contacts the array of cooling pins 122 to remove the heat therefrom.

The support member 140 includes an inlet channel 142 and an outlet channel 144. The inlet channel 142 to provide a fluid to the array of cooling pins 122. The inlet channel 142 receives the fluid and transports the fluid therethrough towards the cooling channel 326. The inlet channel 142 may include a fluid control mechanism 243 including at least one protrusion 245 extending across the inlet channel 142 to evenly or uniformly distribute the fluid to a cooling channel 326. The outlet channel 144 to receive the fluid from the array of cooling pins 122. The outlet channel 144 to receive the fluid from the cooling channel 326 and transport the fluid away from the cooling channel 326.

At least one valve 250 connects to the support member 140. The valve 250 includes a thermally actuated valve or a valve actuated by other control mechanisms. The valve 250 extends through the outlet channel 144 and the gasket 160 into a cooling channel 326 formed between the thermal member 120 and the gasket 160. For example, a thermally actuated valve controls the flow of the fluid through the cooling channel 326 by extending and retracting based on the temperature of the fluid in the cooling channel 326, as described above with reference to FIG. 2. The gasket 160 may provide a seal between the outlet channel 144 and the cooling channel 326, for example, a seal formed between the outlet apertures 268 and the outlet interface 269.

The gasket 160 to be positioned between the thermal member 120 and the support member 140 to form a cooling channel 326 with a fluid tight seal therebetween, i.e., along the perimeter of the cooling channel 326. The gasket 160 includes a seal member 264 to mate with the support member 140. The seal member 264 extends between the thermal member 120 and the support member 140. The seal member 264 may be formed of a silicone or rubber material. The compressible gasket 160 enables the array of cooling pins 122 to contact the gasket 160 and form a fluid tight seal.

The compressibility of the seal member 264 also provides the ability to properly align the thermal member 120 against the heat block such that the thermal member 120 lies flush with the heat block and forms a thermal connection that transfers heat therebetween via a dry disconnect. The seal member 264 selectively compresses to align the mating member 224 flush with a heat block that receives heat from an electronic device. For example, the seal member 264 may be compressed one to two millimeters to enable fine alignment of the thermal member 120 and account for adjustments necessary to accommodate tolerances between the thermal member 120 and the heat block and improve surface contact therebetween.

The gasket 160 further includes an inlet aperture 266 and at least one outlet aperture 268, illustrated as two outlet apertures. The inlet aperture 266 interfaces with the inlet channel 142 at an inlet interface 267 and the outlet aperture 268 interfaces with the outlet channel 144 at an outlet interface 269. The inlet and outlet apertures 266, 268 may provide a seal around the openings to prevent leaks around to inlet and outlet interfaces 267, 269. Moreover, when the valve 250 is inserted through the inlet and/or outlet apertures 266, 268, the inlet and outlet apertures 266, 268 provide thermal isolation to prevent contamination of the fluids in the inlet and/or outlet channels 142, 144 from being heated or cooled by the water in the cooling channel 326, i.e., the fluid surrounding the array of cooling pins 122.

When assembled, a cooling channel 326 is formed between the thermal member 120 and the gasket 160. The cooling channel 326 forms in the space between the array of cooling pins 122 and the support member 140. The array of cooling pins 122 are illustrated in FIG. 5 as contacting the gasket 160 and the support member 140 to distribute stress of the compression across the whole array of cooling pins 122 and aid in maintaining the fluid tight seal. However, other arrangements of the array of cooling pins 122 may vary and a portion of the array of cooling pins 122 may not contact the gasket 160.

The gasket 160 seals the fluid in the cooling channel 326. For example, the seal member 264 extends past the perimeter of the thermal member 120 and support member 140 to provide a fluid tight seal therebetween. The fluid tight seal also prevents fluid from leaking and/or bypassing the array of cooling pins 122. The array of cooling pins 122 may extend to contact the gasket 160 to provide additional assurance that the fluid does not bypass the cooling pins.

A support member 140 supports at least one thermal member 120. For example, two thermal members 120 may be connected to a support member 140. The thermal members 120 may be connected to the support member 140 and the gasket 160 using, for example, at least one fastener 229, such as a clip, an adhesive gasket, and/or a screw. The fluid control mechanism 243 may be a separate insert to slideably attach to the inlet channel 142. For example, the fluid control mechanism 243 illustrated above in FIG. 2 includes a first protrusion 245 prior to the inlet interface 267 of the first thermal member 120A and a second protrusion 245 prior to the inlet interface 267 of the second thermal member 120B. The support member 140 may be encased by a clamp member 270 that holds the thermal member 120 and gasket 160 together. For example, the clamp member 270 is a stainless steel straddle clamp.

The cooling system 400 illustrates that the support members 140 may be connected to one another using a connector member 280 that enables movement or adjustment between the support members 140. The movement allows for the thermal member 120 to mate and align with a heat block by taking into account tolerance and alignment variations between adjacent heat blocks, i.e., the movement allows angular adjustments. The alignment variations enable angular rotation and positioning of the thermal member 120 and support member 140. For example, the support member 140 includes a first support member 140A and a second support member 140B, and a connector member 280 therebetween. The first support member 140A and the second support member 140B to provide movement of the first support member 140A and the second support member 140B independent of one another using flexibility built into the connector member 280 and the compressible gasket 160.

The connector member 280 includes an inlet connector 582 and an outlet connector 584. For example, the inlet connector 582 and the outlet connector 584 form a channel connector to connect to the inlet channel 142 and the outlet channel 144. The inlet and outlet connectors 582, 584 may be formed in the support members 140, such that the inlet connector 582 receives a flexible inlet channel 586 and the outlet connector 584 receives a flexible outlet channel 588.

The flexible inlet channel 586 to provide a flexible connection with the inlet channel 142 via the inlet connector 582. The flexible outlet channel 588 to provide a flexible connection with the outlet channel 144 via the outlet connector 584. The flexible inlet and outlet channels 586, 588 may be formed of flexible tubes that may be inserted into the inlet and outlet connectors 582, 584 respectively to allow for movement and/or alignment of the thermal members 120 for optimal mating with a heat block. The inlet and outlet connectors 582, 584 may be formed within a connector cap 581 that is attached to a portion 583 of the support member 140. The connector cap 581 may be formed of a rigid member, such as a dense piece of foam, that is formed to receive the flexible inlet and outlet channels 586, 588. The connector caps 581 to allow inlet and outlet tubes of various lengths to be slideably inserted therein.

The support member 140 may also include an end cap 290 with an inlet member 292 and an outlet member 294 attached thereto, as illustrated in FIG. 2. The inlet member 292 and the outlet member 294 are connected to the inlet channel 142 and the outlet channel 144, respectively. For example, the inlet member 292 and the outlet member 294 are positioned diagonal to one another. A fluid supply line 196 is connected to the inlet member 292 to supply fluid to the inlet channel 142 and fluid return line 298 is connected to the outlet member 194 to remove the fluid from the outlet channel 144. A fastener 299, such as a clip, an adhesive gasket, and/or a screw, may also be used to secure the end cap 290 to the support member 140.

Figure 6:
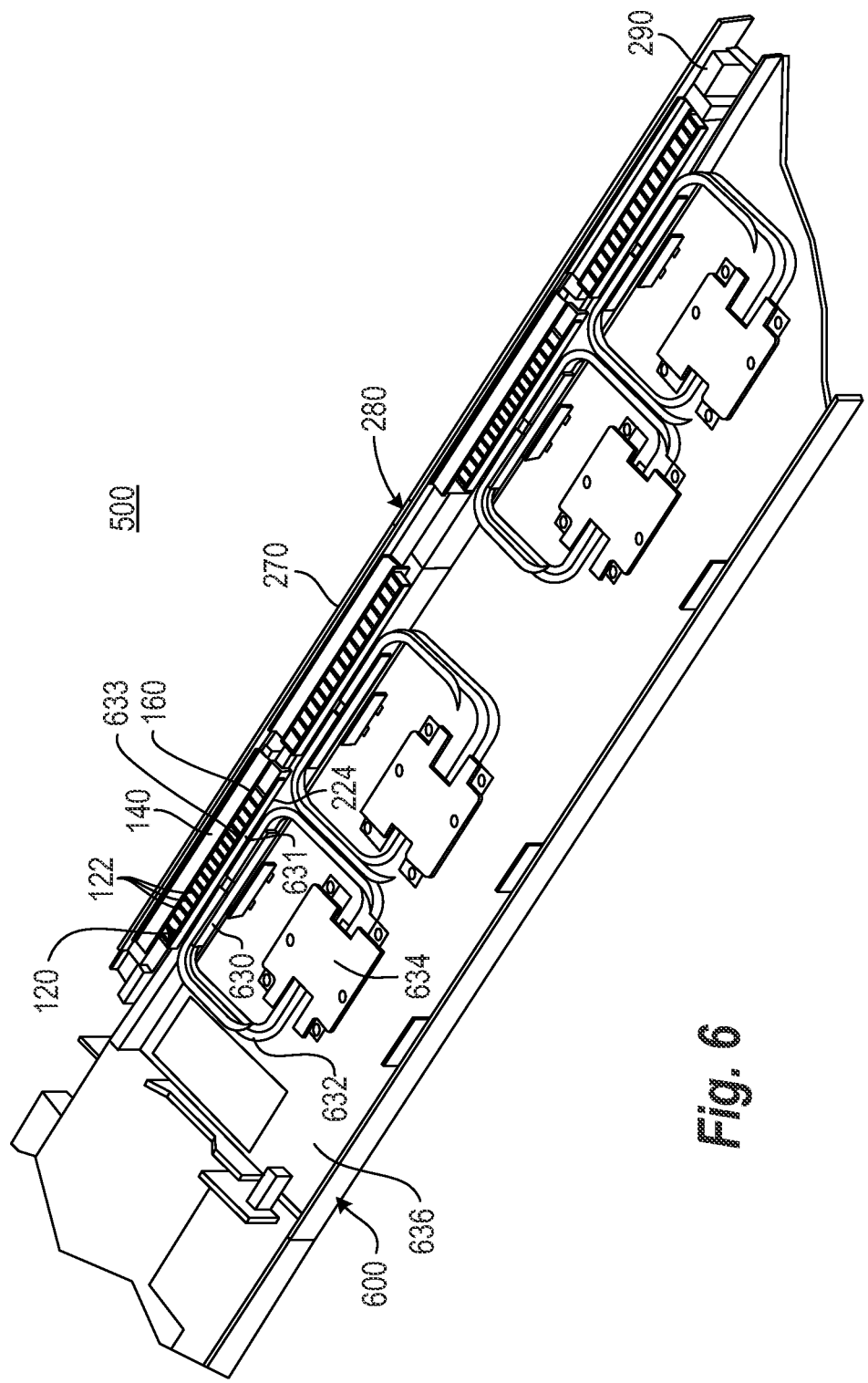
FIG. 6 illustrates a schematic diagram of the cooling system of FIG. 4 according to an example.

FIG. 6 illustrates a schematic diagram of the cooling system 400 of FIG. 4 according to an example. The cooling system 400 is illustrated connected to an electronic device 600. The mating member 224 of the thermal member 120 is illustrated as mated with a heat block 630. The heat block 630 may include, for example, a condenser plate that includes a thermal mating surface 631 that aligns with the mating member 224, such that the heat is transferred via the thermal mating surface 631. The heat block 630 may optionally include a thermal interface 633 connected thereto. The thermal interface 633 may be formed of a graphite or elastomer member that fills in the micro structure between the heat block 630 and the mating member 224 of the thermal member 120 to provide a better thermal connection therebetween. Alternatively, the thermal interface 633 may be connected to the mating member 224.

The heat block 630 thermally connects to a heat pipe 632. The heat pipe 632 thermally connects to a heat sink 634, such as an evaporator block, to passively remove heat from the heat sink 634. The heat sink 634 removes heat from an electronic component 636. The heat sink 634 engages with the electronic component 636 and forms a thermal connection therebetween. The electronic components 636 include, for example, a central processing unit (CPU), a graphical processing unit (GPU), a printed circuit board (PCB), and/or heat producing supplementary devices such as, memory, power supply devices within the electronic component.

As illustrated in FIG. 6, the fluid enters the cooling system 400 and only enters and exits the cooling system 400 at the end cap 290. The temperature of the fluid that enters the cooling system 400 may be optionally monitored and/or set to a predefined temperature (range) prior to entry into the cooling system 400. The fluid temperature rises as the fluid absorbs heat from the thermal members 120. The fluid typically exits the cooling system 400 at a higher temperature. The fluid exchanges remain within the cooling system 400 and do not enter the electronic device 600. The cooling system 400 provides an efficient liquid cooling method that cools electronic devices by removing heat transported to the heat block 630, such as an outer surface of electronic device without the risk of leakage within the electronic device 600. For example, in a server the liquid cooling occurs at the rack level instead of the server level where the central processing unit and other electronic components 636 are located.

Figure 7:
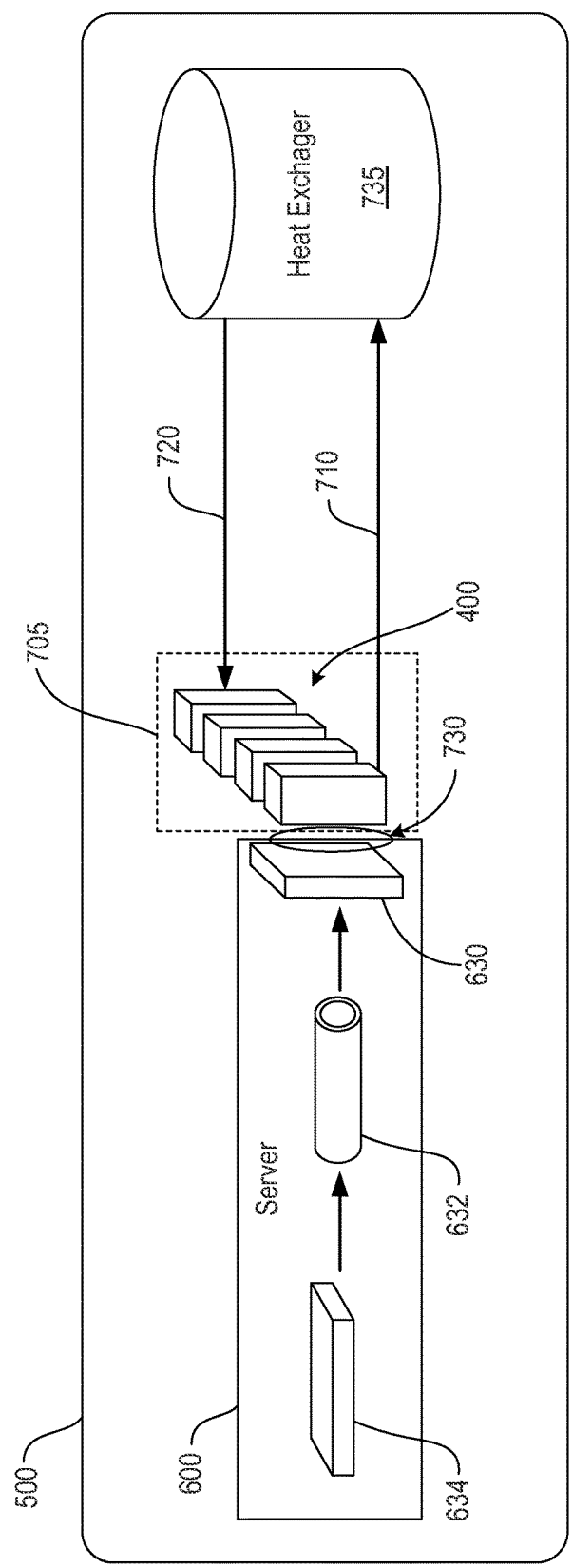
FIG. 7 illustrates a perspective diagram of the cooling system of FIG. 4 according to an example.

FIG. 7 illustrates a perspective diagram of the cooling system 400 of FIG. 4 according to an example. The cooling system 400 illustrates how heat from an electronic device 600, such as a server within a server enclosure is collected at the heat sink 634. The heat leaves the heat sink 634 via heat pipes 632. The heat is transferred from the heat pipes 632 to a heat block 630 that provides a dry disconnect 730 between the electronic device 600 and the thermal member 120. For example, the dry disconnect 730 is between the server and the server rack 705 that includes the cooling system 400, including the thermal member 120, the support member 140, the gasket 160, and the connector member 280 as described above.

As illustrated and described above in FIGS. 1-5 the heat is transferred to the thermal member 120. The heat is transferred from the thermal member 120 to the fluid using the array of cooling pins 122. The heat exits the thermal member 120 with the fluid, for example the fluid at a higher temperature. The fluid at the higher temperature is removed from the assembly 100 and/or the cooling system 400, via, for example, the outlet member 294 and the fluid return line 298 of FIGS. 3 and 5.

Referring back to FIG. 7, once removed from the assembly 100, the fluid is sent 710 to a cooling facility that removes the heat from the fluid using a cooling mechanism, such as a heat exchanger 735. The fluid with the heat removed therefrom, for example a fluid at a lower temperature, is sent back 720 to the inlet channel 142, via, for example, the inlet member 292 of FIGS. 2 and 5, and through the support member 140 as the process repeats.

The modular design of the cooling system 400 simplifies manufacturing, assembly, and maintenance. For example, the electronic device 600 includes a heat block 630 that lines up with the thermal member 120. The other aspects of the electronic device 600, such as the electronic components 636, the heat pipes 632 and heat sink 634 may vary and be interchangeable. Moreover, the modular nature of the cooling system 400 makes it easier to maintain electronic devices, such as allowing for removal of one of the servers without disrupting the other servers.

FIG. 8 illustrates a flow chart 800 of a method to remove heat from a first and second electronic device according to an example. The method positions a first support member to thermally connect a first thermal member with a first heat block in block 820. The first thermal member to receive heat from a first electronic device. In block 840, a second support member aligned to thermally connect a second thermal member with a second heat block. The second thermal member to receive heat from a second electronic device.

The fluid is transported via an inlet channel in block 860. The inlet channel transports the fluid to the first support member and a first cooling channel receives the fluid and removes heat from the first thermal member. The inlet channel transports the fluid to the second support member via a connector member. A second cooling channel receives the fluid and removes heat from the second thermal member. In block 880, the fluid is removed via an outlet channel. The outlet channel transports the fluid away from the first support member and the first cooling channel via an outlet member. The outlet channel transports the fluid away from the second support member and a second cooling channel via the connector member that transports the fluid towards the outlet member.

Although the flow diagram of FIG. 8 illustrates specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present invention.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. An assembly to provide liquid cooling, the assembly comprising:
   a thermal member including an array of cooling pins, the array of cooling pins extend from the thermal member, the array of cooling pins formed of a thermally conductive material;
   a support member including an inlet channel and an outlet channel, the inlet channel to provide a fluid to the array of cooling pins, the outlet channel to receive the fluid from the array of cooling pins; and
   a gasket between the thermal member and the support member to form a cooling channel with a fluid tight seal therebetween, wherein the gasket comprises a seal member to extend between the thermal member and the support member, and wherein the seal member selectively compresses to align a mating member flush with a heat block that receives heat from an electronic device.

2. The assembly of claim 1, wherein the thermal member includes the array of cooling pins on one side and the mating member on an opposite side,
   the array of cooling pins to extend from the thermal member towards the gasket and receive the fluid therebetween; and
   the mating member to be positioned adjacent to the heat block such that the heat block transfers heat from the electronic device to the thermal member via the mating member and the fluid contacts the array of cooling pins to remove the heat therefrom.

3. The assembly of claim 1, wherein the seal member engages with the support member, the seal member including a flexible side wall that extends from the thermal member and selectively compresses to align the mating member flush with the heat block that receives heat from the electronic device.

4. The assembly of claim 1, further comprising a fluid control mechanism including at least one protrusion extending across the inlet channel to evenly distribute the fluid to the cooling channel.

5. The assembly of claim 1, further comprising a thermally actuated valve connected to the support member, the thermally actuated valve extending through the outlet channel and the gasket into a cooling channel formed between the thermal member and the gasket, the thermally actuated valve to control the flow of the fluid through the cooling channel by extending and retracting based on the temperature of the fluid in the cooling channel.

6. The assembly of claim 1, wherein
   the inlet channel receives the fluid and transports the fluid therethrough towards the cooling channel; and
   the outlet channel receives the fluid from the cooling channel and transports the fluid away from the cooling channel.

7. A cooling system to provide liquid cooling comprising:
   a thermal member including an array of cooling pins, the array of cooling pins extend from the thermal member, the array of cooling pins formed of a thermally conductive material;
   a support member including an inlet channel and an outlet channel, the inlet channel to provide a fluid to the array of cooling pins, the outlet channel to receive the fluid from the array of cooling pins;
   a gasket between the thermal member and the support member to form a fluid tight seal therebetween, wherein the gasket comprises a seal member to extend between the thermal member and the support member, and wherein the seal member selectively compresses to align a mating member flush with a heat block that receives heat from an electronic device; and
   a connector member extending from the support member to provide movement of the support member during alignment of the thermal member with the heat block.

8. The cooling system of claim 7, wherein the thermal member includes the array of cooling pins on one side and the mating member on an opposite side,
   the array of cooling pins to extend from the thermal member towards the gasket and receive the fluid therebetween; and
   the mating member to be positioned adjacent to the heat block such that the heat block transfers heat from the electronic device to the thermal member via the mating member and the fluid contacts the array of cooling pins to remove the heat therefrom.

9. The cooling system of claim 7, wherein the support member comprises a first support member and a second support member, and a connector member between the first support member and the second support member to provide movement of the first support member and the second support member independent of one another.

10. The cooling system of claim 7, wherein the connector member comprises:
    a channel connector to connect to the inlet channel and the outlet channel;
    a flexible inlet channel to provide a flexible connection with the inlet channel via the channel connector; and
    a flexible outlet channel to provide a flexible connection with the outlet channel via the channel connector.

11. The cooling system of claim 7, further comprising a thermally actuated valve connected to the support member, the thermally actuated valve extending through the outlet channel and the gasket into a cooling channel formed between the thermal member and the gasket, the thermally actuated valve to control the temperature of the fluid in the cooling channel by extending and retracting based on the temperature of the fluid in the cooling channel.

12. The cooling system of claim 7, further comprising:
   an inlet member to supply the fluid to the inlet channel, and
   an outlet member to remove the fluid from the outlet channel.

13. An assembly to provide liquid cooling, the assembly comprising:
   a thermal member including an array of cooling pins, the array of cooling pins extend from the thermal member, the array of cooling pins formed of a thermally conductive material;
   a support member including an inlet channel and an outlet channel, the inlet channel to provide a fluid to the array of cooling pins, the outlet channel to receive the fluid from the array of cooling pins; and
   a gasket between the thermal member and the support member to form a cooling channel with a fluid tight seal therebetween, wherein the gasket comprises a seal member to engage with the support member, the seal member including a flexible side wall that extends from the thermal member and selectively compresses to align the mating member flush with a heat block that receives heat from an electronic device.

14. The assembly of claim 13, wherein the gasket comprises a seal member to extend between the thermal member and the support member, the seal member selectively compresses to align the mating member flush with a heat block that receives heat from an electronic device.

15. The assembly of claim 13, further comprising a thermally actuated valve connected to the support member, the thermally actuated valve extending through the outlet channel and the gasket into a cooling channel formed between the thermal member and the gasket, the thermally actuated valve to control the flow of the fluid through the cooling channel by extending and retracting based on the temperature of the fluid in the cooling channel.

* * * * *